(12) United States Patent
Kanazawa et al.

(10) Patent No.: US 11,381,131 B2
(45) Date of Patent: Jul. 5, 2022

(54) ELECTRIC DRIVE DEVICE AND ELECTRIC POWER STEERING DEVICE

(71) Applicant: HITACHI AUTOMOTIVE SYSTEMS, LTD., Hitachinaka (JP)

(72) Inventors: Takuro Kanazawa, Hitachinaka (JP); Haruaki Motoda, Hitachinaka (JP)

(73) Assignee: HITACHI ASTEMO, LTD., Hitachinaka (JP)

( * ) Notice: Subject to any disclaimer, the term of this patent is extended or adjusted under 35 U.S.C. 154(b) by 203 days.

(21) Appl. No.: 16/644,882

(22) PCT Filed: May 11, 2018

(86) PCT No.: PCT/JP2018/018242
§ 371 (c)(1),
(2) Date: Mar. 5, 2020

(87) PCT Pub. No.: WO2019/049423
PCT Pub. Date: Mar. 14, 2019

(65) Prior Publication Data
US 2020/0287440 A1    Sep. 10, 2020

(30) Foreign Application Priority Data

Sep. 7, 2017   (JP) .............................. JP2017-171711

(51) Int. Cl.
*H02K 5/22*        (2006.01)
*B62D 5/04*        (2006.01)

(52) U.S. Cl.
CPC ............. *H02K 5/22* (2013.01); *B62D 5/0406* (2013.01)

(58) Field of Classification Search
CPC ...... H02K 5/22; H02K 5/225; H02K 11/0094; H02K 11/33; H02K 5/18; H02K 9/02;
(Continued)

(56) References Cited

U.S. PATENT DOCUMENTS 7,932,651 B2 *   4/2011   Fujimoto ............. B62D 5/0406
                                                   310/68 B
8,985,265 B2 *   3/2015   Hagiwara ............ B62D 5/0406
                                                   180/443
(Continued)

FOREIGN PATENT DOCUMENTS

JP    2012-006419 A    1/2012
JP    2014-189166 A    10/2014
(Continued)

OTHER PUBLICATIONS

International Search Report with English translation issued in corresponding application No. PCT/JP2018/018242 dated Jul. 31, 2018.

(Continued)

*Primary Examiner* — John K Kim
(74) *Attorney, Agent, or Firm* — Foley & Lardner LLP

(57) ABSTRACT

An electric drive device includes: a motor housing for housing an electric motor, wherein the motor housing includes an end face part opposite to an output part of a rotating shaft of the electric motor; and an electronic control part arranged at the end face part. The electronic control part includes a control circuit part, a power supply circuit part, and a power conversion circuit part, which are covered by a metal cover, wherein the metal cover is fixed water-tightly to the end face part. The end face part includes a power conversion heat dissipation region and a power supply heat dissipation region. Each of the control circuit part and the power supply circuit part is contained on a circuit board, wherein the circuit board is placed along a plane perpendicular to the rotating shaft, and layered with each other in an axial direction of the rotating shaft.

14 Claims, 7 Drawing Sheets

(58) Field of Classification Search
CPC .............. H02K 11/30; H02K 2211/03; H02K 2213/03; B62D 5/0406; B62D 5/04; B62D 5/0403; H05K 7/20; H05K 7/209
USPC .......................................................... 310/89
See application file for complete search history.

(56) References Cited

U.S. PATENT DOCUMENTS

| | | | |
|---|---|---|---|
| 9,912,212 B2* | 3/2018 | Maeshima | ............. H02K 5/225 |
| 10,797,566 B2* | 10/2020 | Kanazawa | ............. H02K 9/223 |
| 10,826,355 B2* | 11/2020 | Kanazawa | ............... H02K 5/10 |
| 2019/0044406 A1* | 2/2019 | Yamamoto | ............... H02K 5/10 |
| 2020/0287440 A1* | 9/2020 | Kanazawa | ......... H02K 11/0094 |

FOREIGN PATENT DOCUMENTS

| | | |
|---|---|---|
| JP | 2015-134598 A | 7/2015 |
| JP | 2016-146702 A | 8/2016 |

OTHER PUBLICATIONS

Written Opinion with English translation issued in corresponding application No. PCT/JP2018/018242 dated Jul. 31, 2018.

* cited by examiner

ELECTRIC DRIVE DEVICE AND ELECTRIC POWER STEERING DEVICE

BACKGROUND

The present invention relates generally to an electric drive device and an electric power steering device, and particularly to an electric drive device and an electric power steering device in which an electronic control unit is provided.

In a general field of industrial machinery, a controlled object of a mechanical system is driven by an electric motor. In recent years, employment of an electric drive device of mechatronical integration type has been started, wherein the electric drive device includes both of an electric motor and an electronic control unit in a package, and wherein the electronic control unit includes semiconductor elements and others for controlling rotational speed and torque of the electric motor.

As an example of electric drive device of mechatronical integration type, an electric power steering device for an automotive vehicle includes an electric motor, and an electronic control unit (ECU) for controlling the electric motor, wherein the electronic control unit is configured to sense a direction and a torque of rotation of a steering shaft rotated by driver's operation of a steering wheel, and drive the electric motor based on these sensed values, to produce a steering assist torque to rotate the steering shaft in the direction of rotation of the steering shaft.

Japanese Patent Application Publication No. 2015-134598 (patent document 1) discloses a known conventional electric power steering device composed of an electric motor section and an electronic control section. In the electric motor section, an electric motor is housed in a motor housing, wherein the motor housing has a cylindrical part made of an aluminum alloy or the like. In the electronic control section, a board provided with electrical components is attached to a heat sink serving as an ECU housing, wherein the ECU housing is arranged at a side of the motor housing opposite to an output shaft of the electric motor in its axial direction. The board attached to the heat sink is provided with a power supply circuit part, a power conversion circuit part, and a control circuit part, wherein the power conversion circuit part includes power switching elements such as MOSFETs or IGBTs for driving and controlling the electric motor, and wherein the control circuit part is configured to control the power switching elements. Output terminals of the power switching elements and input terminals of the electric motor are connected electrically via a bus bar.

This electronic control part attached to the heat sink is supplied with electric power from a power supply via a connector case made of synthetic resin, and also supplied with a sensing signal indicating operating states and others from sensors and others. The connector case serves as a cover fixed to hermetically cover the heat sink, and is fixed to a surface of an outer periphery of the heat sink by fixing bolts.

Other known examples of electric drive device where an electronic control device is integrally provided include an electric brake device, and an electric hydraulic pressure control device for control of various hydraulic pressures. The following describes an electric power steering device as a representative example.

PATENT DOCUMENT(S)

Patent Document 1: Japanese Patent Application Publication No. 2015-134598

SUMMARY

The electric power steering device disclosed in patent document 1 is required to be made compact, because the electric power steering device is mounted within an engine room of an automotive vehicle. Especially, in an engine room of a modern automotive vehicle, many auxiliary devices such as exhaust gas treatment devices and safety enhancement devices are mounted in general. This demands to make each auxiliary device such as an electric power steering device as compact, and reduce the number of components of each auxiliary device as small as possible.

In an electric power steering device as disclosed in patent document 1, a heat sink member is arranged between a motor housing and a connector case for dissipating heat especially from a power supply circuit part and a power conversion circuit part to the outside. The provision of the heat sink member leads to enlarging the axial length of the electric power steering device. Moreover, since electrical components constituting the power supply circuit part and the power conversion circuit part generate a large quantity of heat, it is required to effectively dissipate the heat to the outside, especially when the electric power steering device is made compact. Accordingly, it is desirable to provide an electric drive device which is made as compact in the axial direction as possible and in which heat is effectively dissipated from a power supply circuit part and a power conversion circuit part to the outside.

It is desirable to provide a new electric drive device and a new electric power steering device which are made as compact in the axial direction as possible and in which heat is effectively dissipated from a power supply circuit part and a power conversion circuit part to the outside.

The present disclosure is characterized by comprising a motor housing structured to house an electric motor, wherein the motor housing includes an end face part opposite to an output part of a rotating shaft of the electric motor, and wherein the electric motor is structured to drive a controlled object of a mechanical system; and an electronic control part arranged at the end face part of the motor housing, and configured to drive the electric motor, wherein the electronic control part includes a control circuit part, a power supply circuit part, and a power conversion circuit part; wherein the end face part of the motor housing includes a power conversion heat dissipation region and a power supply heat dissipation region, wherein the power conversion circuit part is mounted to the power conversion heat dissipation region, and wherein the power supply circuit board is mounted to the power supply heat dissipation region; each of the control circuit part and the power supply circuit part is contained on a circuit board, wherein the circuit board is placed along a plane perpendicular to the rotating shaft of the electric motor, and layered with each other in an axial direction of the rotating shaft of the electric motor; and the control circuit part, the power supply circuit part, and the power conversion circuit part are covered by a metal cover, wherein the metal cover is fixed water-tightly to the end face part of the motor housing.

According to the present disclosure, the feature that generated heat of the power supply circuit part and the power conversion circuit part is transferred to the end face part of the motor housing makes it possible to shorten the axial size with no heat sink member provided. Moreover, since the motor housing has a sufficient thermal capacity, the heat generated in the power supply circuit part and the power conversion circuit part can be dissipated to the outside effectively. Furthermore, the heat generated in the power supply circuit part and the power conversion circuit part can be dissipated to the outside effectively via the metal cover.

DETAILED DESCRIPTION

The following details an embodiment of the present invention with reference to the drawings. However, the present invention is not limited to the embodiment, but contains various modifications and applications belonging to technical conception of the present invention.

Figure 1:
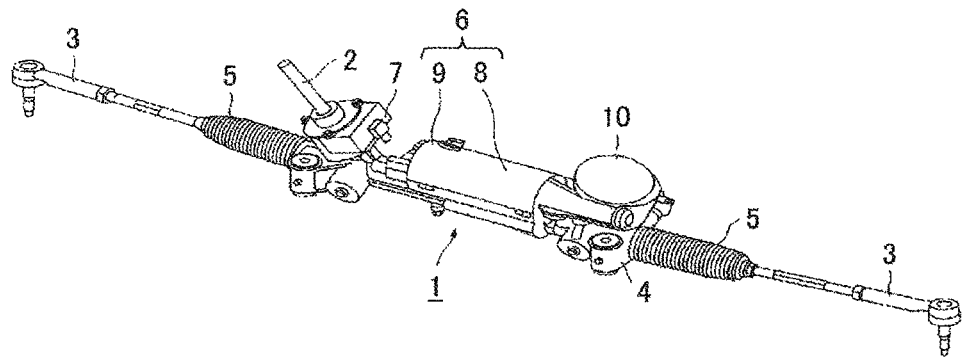
FIG. 1 is a whole perspective view of a steering device as an example of device.

The following briefly describes configuration of a steering device as an example of device, with reference to FIG. 1, prior to description of the embodiment of the present invention.

First, the following describes a steering device for steering front wheels of an automotive vehicle. Steering device 1 is configured as shown in FIG. 1. A steering shaft 2 is connected to a steering wheel not shown, and includes a lower end formed with a pinion not shown, wherein the pinion is in mesh with a rack not shown, wherein the rack extends in a vehicle body lateral direction. The rack includes ends linked to respective tie rods 3 for steering the front wheels leftward and rightward, and is housed by a rack housing 4. A rubber boot 5 is provided between rack housing 4 and each tie rod 3.

An electric power steering device 6 is provided for producing an assist torque while the steering wheel is being turned. Specifically, electric power steering device 6 includes a torque sensor 7, an electric motor section 8, and an electronic control section or unit (ECU) 9, wherein torque sensor 7 is structured to sense a direction of rotation of steering shaft 2, and a rotating torque applied to steering shaft 2, wherein electric motor section 8 is structured to apply a steering assist force to the rack via a gear 10 depending on a sensed value from torque sensor 7, and wherein electronic control section 9 is configured to control an electric motor arranged in electric motor section 8. Electric motor section 8 of electric power steering device 6 is connected to gear 10 by three bolts not shown at three spots of an outer peripheral part of an output shaft side of electric motor section 8. Electronic control section 9 is arranged at a side of electric motor section 8 opposite to an output shaft of electric motor section 8.

Electric power steering device 6 operates as follows. As the steering wheel is turned to rotate steering shaft 2 in one direction, torque sensor 7 then senses the direction of rotation of steering shaft 2, and the rotating torque applied to steering shaft 2. A control circuit part calculates a quantity of operation of the electric motor, based on a sensed value from torque sensor 7. Power switching elements of a power conversion circuit part are controlled to drive the electric motor based on the calculated quantity of operation, so that an output shaft of the electric motor is rotated to drive the steering shaft 2 in the same direction as the direction of operation of the steering wheel. The rotation of the output shaft of the electric motor is transferred to the rack via the pinion and gear 10, thereby steering the automotive vehicle. Further description is omitted because its configuration and operation are well known.

As described above, in an electric power steering device as disclosed in patent document 1, a heat sink member is arranged between a motor housing and a connector case for dissipating heat especially from a power supply circuit part and a power conversion circuit part to the outside. The provision of the heat sink member leads to enlarging the axial length of the electric power steering device. Moreover, since electrical components constituting the power supply circuit part and the power conversion circuit part generate a large quantity of heat, it is required to effectively dissipate the heat to the outside, especially when the electric power steering device is made compact. Accordingly, it is desirable to provide an electric drive device which is made as compact in the axial direction as possible and in which heat is effectively dissipated from a power supply circuit part and a power conversion circuit part to the outside.

In view of the foregoing background, according to the present embodiment, an electric power steering device is proposed which is configured as follows. Specifically, according to the present embodiment: a motor housing includes an end face part opposite to an output part of a rotating shaft of an electric motor; the end face part of the motor housing includes a power conversion heat dissipation part and a power supply heat dissipation part for dissipation of heat occurring at least in a power conversion circuit part and a power supply circuit board to the motor housing; each of the control circuit part and the power supply circuit part is composed of a circuit board, wherein the circuit board is placed along a plane perpendicular to the rotating shaft of the electric motor, and layered with each other in an axial direction of the rotating shaft of the electric motor; and the control circuit part, the power supply circuit part, and the power conversion circuit part are covered by a metal cover, wherein the metal cover is fixed to the end face part of the motor housing.

According to this configuration, the feature that generated heat of the power supply circuit part and the power conversion circuit part is transferred to the end face part of the motor housing makes it possible to shorten the axial size with no heat sink member provided. Moreover, since the motor housing has a sufficient thermal capacity, the heat generated in the power supply circuit part and the power conversion circuit part can be dissipated to the outside effectively. Furthermore, the heat generated in the power supply circuit part and the power conversion circuit part can be dissipated to the outside effectively via the metal cover.

Figure 2:
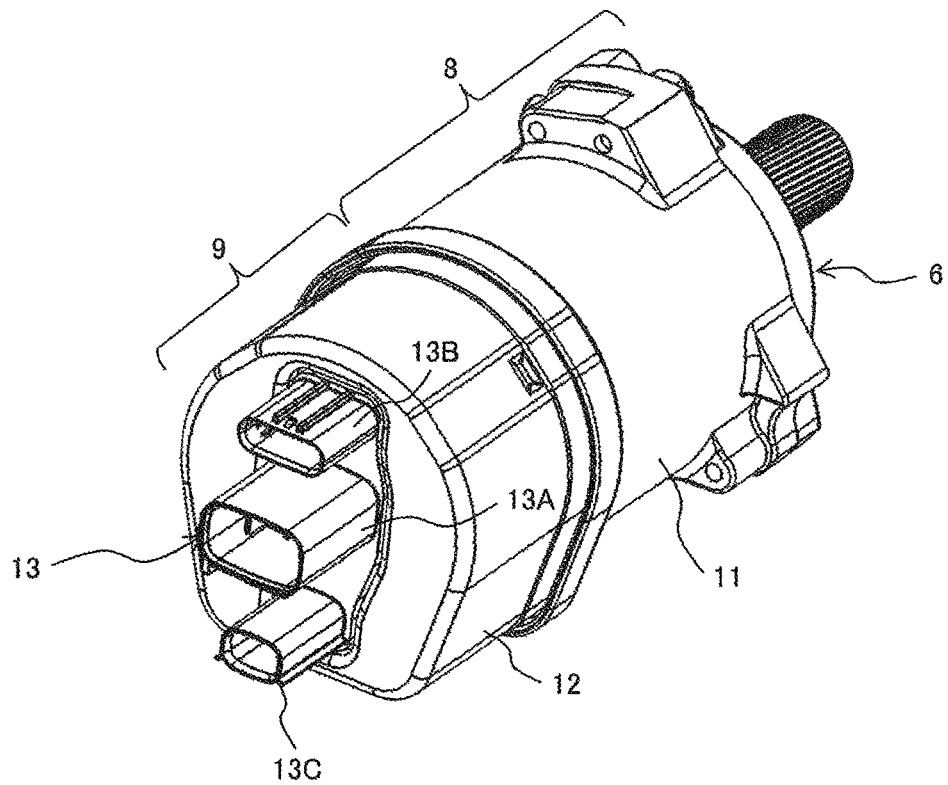
FIG. 2 is a whole perspective view of an electric power steering device according to an embodiment of the present invention.
Figure 3:
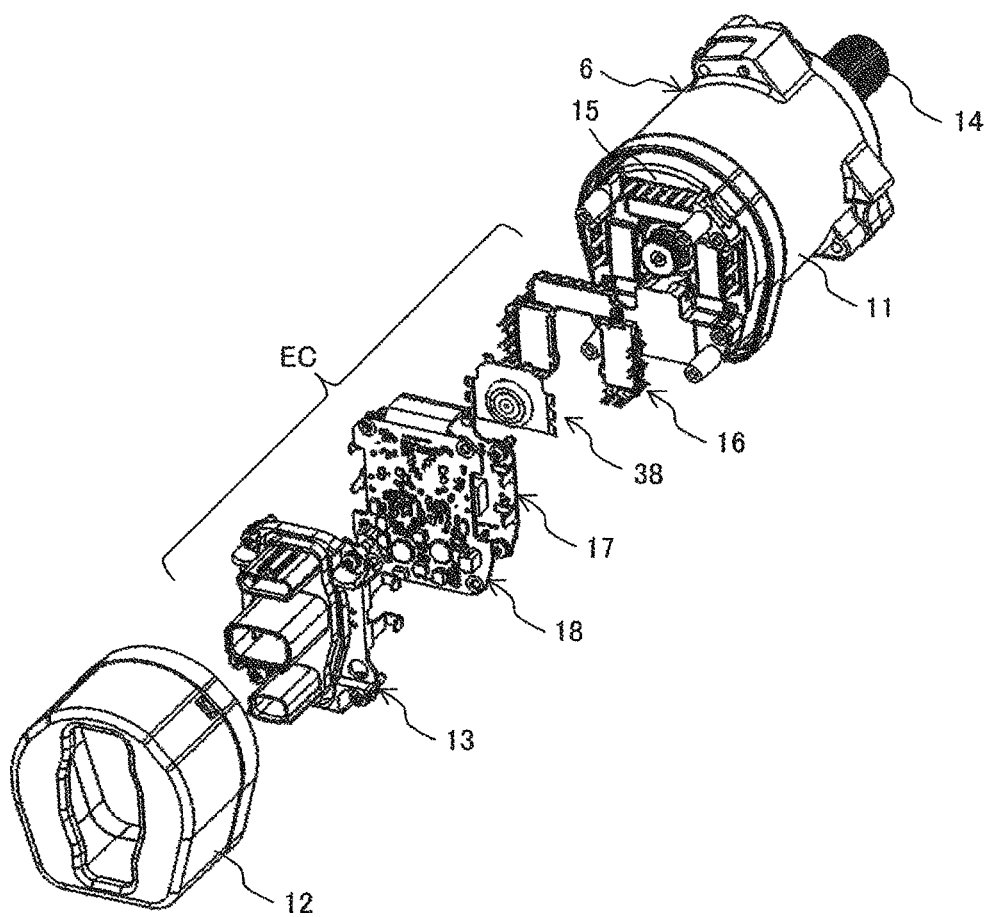
FIG. 3 is an exploded perspective view of the electric power steering device shown in FIG. 2.

The following details specific configuration of the electric power steering device according to the embodiment of the present invention with reference to FIGS. 2 to 9. FIG. 2 shows whole configuration of the electric power steering device according to the present embodiment. FIG. 3 shows components of the electric power steering device shown in FIG. 2 in disassembled state as viewed diagonally. FIGS. 4 to 9 show states of assembling when the components are assembled in an assembling order. The following description refers to these drawings as appropriate.

As shown in FIG. 2, the electric power steering device includes electric motor section 8 and electronic control section 9. Electric motor section 8 includes a motor housing 11 and an electric motor not shown. Motor housing 11 includes a cylindrical part made of an aluminum alloy or the like. The electric motor is housed in motor housing 11. Electronic control section 9 includes a metal cover 12, and an electronic control part not shown housed in metal cover 12. Metal cover 12 is made of an aluminum alloy or the like, and is arranged at a side of motor housing 11 opposite to the output shaft in the axial direction.

Motor housing 11 and metal cover 12 are fixed to each other at their facing end faces by bonding, welding, or bolting. Metal cover 12 includes an accommodation space inside thereof, which accommodates the electronic control part. The electronic control part includes a power supply circuit part for supplying electric power as required, and a power conversion circuit part having power switching elements such as MOSFETs or IGBTs for driving and controlling the electric motor of electric motor section 8, and a control circuit part for controlling the power switching elements. Output terminals of the power switching elements and input terminals of a coil of the electric motor are connected electrically via a bus bar.

A connector terminal assembly 13 is fixed to an end face of metal cover 12 by fixing bolts. Connector terminal assembly 13 includes a connector terminal forming part 13A for power supply, a connector terminal forming part 13B for sensors, and a connector terminal forming part 13C for sending a state of control to external devices. The electronic control part housed in metal cover 12 is supplied with electric power from a power supply via the connector terminal forming part 13A made of synthetic resin, and is supplied with sensing signals indicative of operating states from sensors and others via the connector terminal forming part 13B, and sends a present control state of the electric power steering device via the connector terminal forming part 13C.

FIG. 3 shows electric power steering device 6 in exploded perspective view. Inside of motor housing 11, a side yoke not shown is fitted, wherein the side yoke has an annular shape and is made of iron. The electric motor not shown is mounted inside of the side yoke. The electric motor includes an output part 14 structured to apply a steering assist force to the rack via the gear. Description of specific configuration of the electric motor is omitted because it is well known.

Motor housing 11 is made of an aluminum alloy, thereby serving as a heat sink member for dissipating heat to outside atmosphere, wherein the heat is generated by the power conversion circuit part and the power supply circuit part described below. The electric motor and motor housing 11 form the electric motor section.

Electronic control part EC is attached to an end face wall 15 of motor housing 11 that is an end face part of motor housing 11 opposite to the output part 14 of the electric motor section. Electronic control part EC includes power conversion circuit part 16, power supply circuit part 17, and control circuit part 18. The end face wall 15 of motor housing 11 is formed integrally with motor housing 11, but may be formed separately from motor housing 11 and bolted or welded to motor housing 11.

Power conversion circuit part 16, power supply circuit part 17, and control circuit part 18 are configured to be redundant and form a main electronic control system and an auxiliary electronic control system. Normally, the main electronic control system is employed to drive and control the electric motor, and when an abnormality or failure occurs in the main electronic control system, the control is switched from the main electronic control system to the auxiliary electronic control system so that the auxiliary electronic control system drives and controls the electric motor.

Accordingly, as detailed below, heat of the main electronic control system is normally transferred to motor housing 11. When the main electronic control system is failed or abnormal, operation of the main electronic control system is stopped and the auxiliary electronic control system is operated so that heat of the auxiliary electronic control system is transferred to motor housing 11.

However, although not adopted by the present embodiment, there is an alternative configuration that both of the main and auxiliary electronic control systems are simultaneously employed to form a normal electronic control system, and when one of the main and auxiliary electronic control systems is failed or abnormal, only the other electronic control system is employed to drive and control the electric motor with half of full performance. This ensures a power steering function, although the performance of the electric motor is only half. Accordingly, the heat of the main electronic control system and the auxiliary electronic control system is normally transferred to motor housing 11.

Electronic control part EC is composed of power conversion circuit part 16, power supply circuit part 17, control circuit part 18, and connector terminal assembly 13, which are arranged in this order away from end face wall 15. Control circuit part 18 is configured to generate control signals for driving the power switching elements of power conversion circuit part 16, and includes a microcomputer and a peripheral circuit. Power supply circuit part 17 is configured to supply electric power to drive the control circuit part 18, and supply electric power to power conversion circuit part 16, and includes capacitors, coils, power switching elements, and others. Power conversion circuit part 16 is configured to regulate electric power flowing through the coil of the electric motor, and includes power switching elements and others forming three-phase upper and lower arms.

As detailed below, control circuit part 18 and power supply circuit part 17 are each composed of electric elements contained on a glass epoxy board that is placed in a plane perpendicular to the rotating shaft of the electric motor. Accordingly, control circuit part 18, power supply circuit part 17, and power conversion circuit part 16 are layered together in the axial direction of the rotating shaft of the electric motor.

In electronic control part EC, power conversion circuit part 16 and power supply circuit part 17 generate more quantities of heat than others. The generated heat of power conversion circuit part 16 and power supply circuit part 17 is dissipated via motor housing 11 made of the aluminum alloy. In the present embodiment, a power conversion circuit part holder 38 is attached to end face wall 15 of motor housing 11 at the end part side of the rotating shaft of the electric motor, wherein power conversion circuit part holder 38 includes a resilient function member and a waterproof breathable function member.

The resilient function member of power conversion circuit part holder 38 presses power conversion circuit part 16 to the heat dissipation part of end face wall 15 of motor housing 11, and presses and holds power conversion circuit part 16 on the heat dissipation part. The waterproof breathable function member prevents passing of water and allows passing of air and water vapor, and thereby suppresses the internal pressure of the accommodation space for the electronic control part from fluctuating, and further suppresses water from entering the accommodation space for the electronic control part.

Connector terminal assembly 13, which is made of synthetic resin, is arranged between control circuit part 18 and metal cover 12, and is connected to a vehicle battery (power supply) and external control devices not shown. Connector terminal assembly 13 is also connected to power conversion circuit part 16, power supply circuit part 17, and control circuit part 18.

Metal cover 12 functions to house and seal water-tightly the power conversion circuit part 16, power supply circuit part 17, and control circuit part 18. In the present embodiment, metal cover 12 is welded or bonded to end face wall 15 of motor housing 11. Since metal cover 12 is made of metal, metal cover 12 serves also to dissipate the heat from power conversion circuit part 16, power supply circuit part 17, etc. to the outside.

Figure 4:
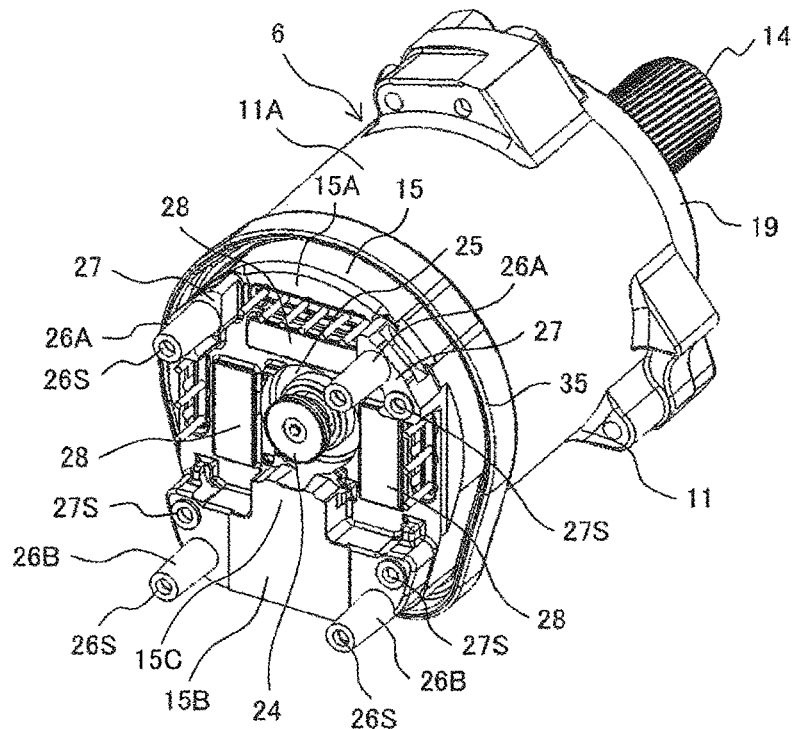
FIG. 4 is a perspective view of a motor housing shown in FIG. 3.
Figure 5:
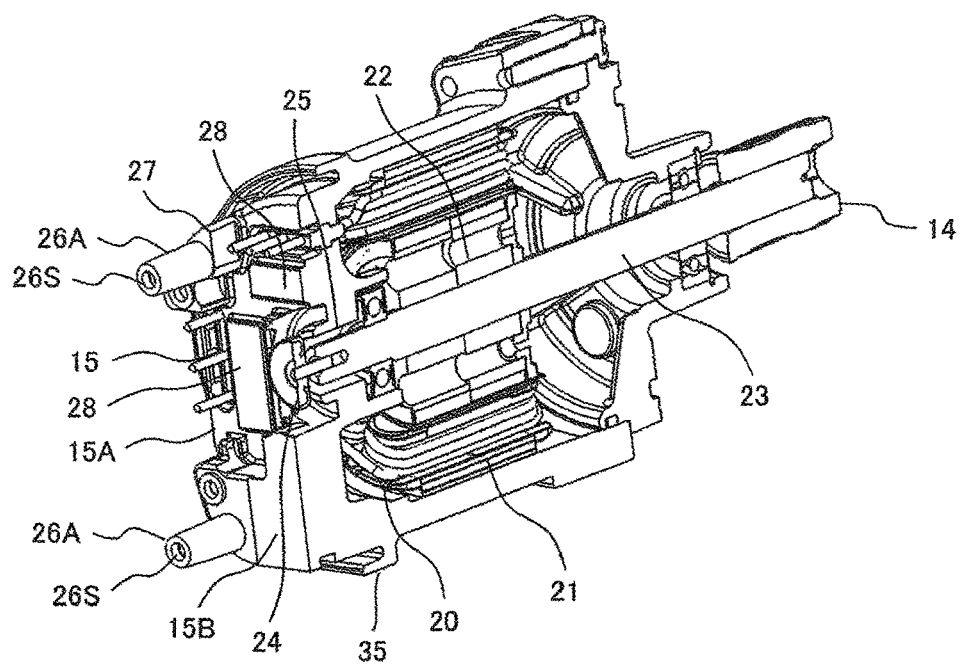
FIG. 5 is a cutaway view of the motor housing shown in FIG. 4, where the motor housing is cut by a plane containing a central axis of the motor housing.

The following describes configuration of the components and a process of assembling the components with reference to FIGS. 4 to 8. FIG. 4 shows an exterior view of motor housing 11, and FIG. 5 shows its axial sectional view.

As shown in FIGS. 4 and 5, motor housing 11 is cylindrically shaped and includes a lateral peripheral surface part 11A, end face wall 15, and an end face wall 19. The end face wall 15 closes a first end of lateral peripheral surface part 11A, whereas the end face wall 19 closes a second end of lateral peripheral surface part 11A. In the present embodiment, lateral peripheral surface part 11A and end face wall 15 are formed integrally such that motor housing 11 has a cylindrical shape having a bottom. The end face wall 19 serves as a cover to cover the second end of lateral peripheral surface part 11A after the electric motor is mounted inside the lateral peripheral surface part 11A.

As shown in FIG. 5, a stator 21 is fitted inside the lateral peripheral surface part 11A, wherein stator 21 is formed by winding the coil 20 around an iron core. A rotor 22 is rotatably mounted inside the stator 21, wherein a permanent magnet is embedded in rotor 22. A rotating shaft 23 is fixed to rotor 22. One end of rotating shaft 23 forms the output part 14, whereas the other end of rotating shaft 23 forms a rotation-sensing target part 24 serving as a target for sensing the rotational phase and speed of rotating shaft 23. Rotation-sensing target part 24 is provided with a permanent magnet, extending through a through hole 25 formed in end face wall 15, and projecting to the outside. The rotational phase and speed of rotating shaft 23 is sensed by a magnetic-sensing part such as a GMR element or the like not shown.

Referring back to FIG. 4, the surface of end face wall 15 opposite to the output part 14 of rotating shaft 23 is formed with heat dissipation regions 15A and 15B for power conversion circuit part 16 and power supply circuit part 17, which is a characterizing feature of the present embodiment. Four corners of end face wall 15 are formed integrally with board-fixing projecting parts 26A, 26B, each of which extends perpendicularly from end face wall 15. Each board-fixing projecting part 26A, 26B is formed with a screw hole 26S inside. Board-fixing projecting parts 26A, 26B are configured to fix a board of control circuit part 18 described below.

Each board-fixing projecting part 26A projecting from power conversion part heat dissipation region (serving as a power conversion circuit mount part) 15A described below is formed with a board-receiving part 27 having the same height as power supply part heat dissipation region (serving as a power supply circuit mount part) 15B described below in the axial direction. Each board-receiving part 27 is configured to mount a glass epoxy board 31 of power supply circuit part 17 described below. Each board-receiving part 27 is formed with a screw hole 27S for fixing the glass epoxy board 31. Similarly, power supply heat dissipation region 15B for power supply circuit part 17 is formed with screw holes 27S for fixing the glass epoxy board 31.

Board-fixing parts 26B formed in power supply heat dissipation region 15B serve as a board-fixing part, along with power supply heat dissipation region 15B, because power supply heat dissipation region 15B is partially employed to position the power conversion circuit part 16, as detailed below.

As shown in FIG. 4, the flat area forming the end face wall 15 and extending in the radial direction and perpendicular to rotating shaft 23 is divided into two regions, namely, power conversion heat dissipation region 15A and power supply heat dissipation region 15B. Power conversion circuit part 16 is attached to power conversion heat dissipation region 15A. Power supply circuit part 17 is attached to power supply heat dissipation region 15B. In the present embodiment, the area of power conversion heat dissipation region 15A is set larger than that of power supply heat dissipation region 15B, for ensuring more space for mounting the power conversion circuit part 16, because power conversion circuit part 16 is implemented by a redundant system as described above, and thereby requires a sufficient mounting space.

Power conversion heat dissipation region 15A and power supply heat dissipation region 15B are provided with a step therebetween such that power conversion heat dissipation region 15A and power supply heat dissipation region 15B have different heights in the axial direction (the direction in which rotating shaft 23 extends). Namely, power supply heat dissipation region 15B is formed with an outward step away with respect to power conversion heat dissipation region 15A in the axial direction of rotating shaft 23 of the electric motor. This step is set to have a height enough to prevent interference between power conversion circuit part 16 and power supply circuit part 17 when power supply circuit part 17 is assembled after power conversion circuit part 16 is assembled.

Power conversion heat dissipation region 15A is formed with three heat dissipation projecting parts 28, wherein each heat dissipation projecting part 28 has a narrow rectangular shape. Heat dissipation projecting parts 28 are configured to mount power conversion circuit part 16 thereon, wherein power conversion circuit part 16 is configured to be redundant as described below. Each heat dissipation projecting part 28 projects away from the electric motor in the direction of rotating shaft 23 of the electric motor.

Power supply heat dissipation region 15B is generally flat and is configured to mount power supply circuit part 17 thereon, where power supply circuit part 17 is described below. Furthermore, power supply heat dissipation region 15B includes an extended heat dissipation region 15C extending toward the axis of rotating shaft 23. When three power conversion circuits 16M, 16S, 16E are placed on respective heat dissipation projecting parts 28 so as to form a U-shape or three-sided rectangle as described below, extended heat dissipation region 15C is formed in a space forming a remainder side of the three-sided rectangle that are formed by the power conversion circuits 16M, 16S, 16E, and extended heat dissipation region 15C is employed for heat dissipation of power supply circuit part 17.

Accordingly, each heat dissipation projecting part 28 serves as a heat dissipation part to transfer heat from power conversion circuit part 16 to end face wall 15, whereas power supply heat dissipation region 15B serves as a heat dissipation part to transfer heat from power supply circuit part 17 to end face wall 15. Each heat dissipation projecting part 28 may be omitted so that power conversion heat dissipation region 15A serves as a heat dissipation part to transfer heat from power conversion circuit part 16 to end face wall 15.

At end face wall 15 of motor housing 11 according to the present embodiment described above, the axial size can be made compact because there is no heat sink member. Moreover, since motor housing 11 has a sufficient thermal capacity, the heat generated in power supply circuit part 17 and power conversion circuit part 16 can be dissipated to the outside effectively.

Figure 6:
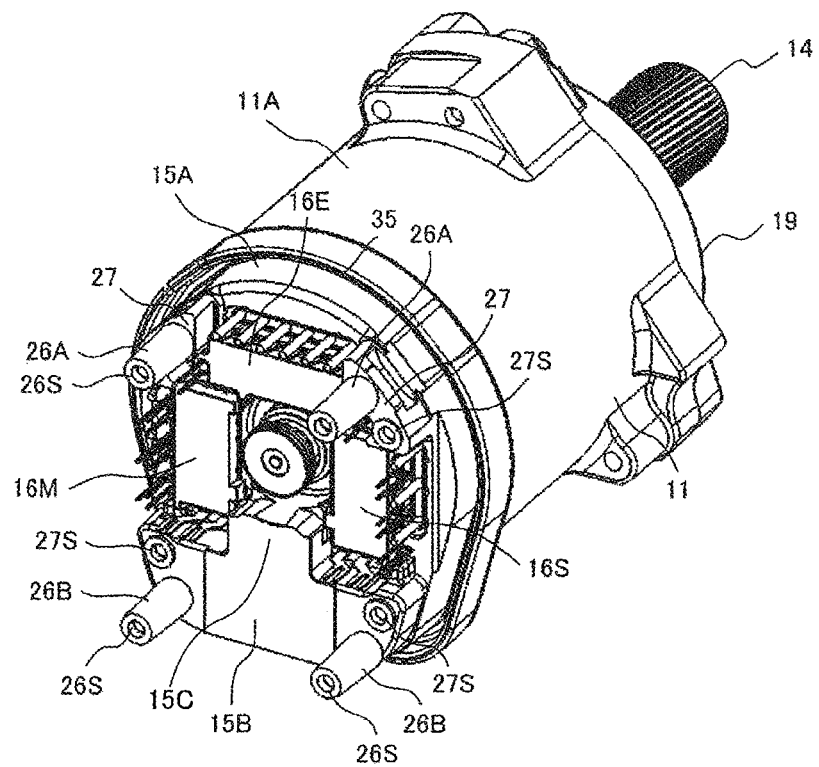
FIG. 6 is a perspective view of the motor housing shown in FIG. 4 where a power conversion circuit part is mounted to the motor housing.

FIG. 6 shows a state where power conversion circuit part 16 is placed on heat dissipation projecting parts 28. As shown in FIG. 6, power conversion circuit part 16, which is configured to be redundant, is placed on heat dissipation projecting parts 28 formed in power conversion heat dissipation region 15A. The power switching elements constituting the power conversion circuit part 16 are placed on a metal board (made of aluminum-based metal in this example), allowing their generated heat to be dissipated effectively. The power switching elements and the power-switching-element-side metal board are packaged by synthetic resin. The metal board may be replaced with a resin board.

In this way, power conversion circuit part 16 is connected thermally to heat dissipation projecting part 28. This allows the generated heat of the power switching elements to be transferred to heat dissipation projecting parts 28 effectively. Heat-conductive grease is provided between power conversion circuit part 16 and heat dissipation projecting part 28 so that heat is transferred from power conversion circuit part 16 to heat dissipation projecting part 28 effectively. Furthermore, as shown in FIG. 3, power conversion circuit part 16 is pressed and held on heat dissipation projecting part 28 by the resilient function member of the power conversion circuit part holder attached to the end part of rotating shaft 23.

The heat transferred to heat dissipation projecting parts 28 is dissipated to power conversion heat dissipation region 15A, and then to lateral peripheral surface part 11A of motor housing 11, and finally to the outside. As described above, power conversion circuit part 16 is prevented from interfering with power supply circuit part 17 described below, because the height of power conversion circuit part 16 is shorter than that of power supply heat dissipation region 15B in the axial direction.

Power conversion circuit part 16 includes a power conversion circuit 16M, an auxiliary power conversion circuit part 16S, and an abnormality-handling circuit part 16E, each of which has a narrow rectangular shape, and is molded by synthetic resin, wherein main power conversion circuit part 16M and power conversion circuit 16S are opposite to each other, wherein power conversion circuit 16E is interposed between power conversion circuit 16M and auxiliary power conversion circuit part 16S.

Main power conversion circuit part 16M, power conversion circuit 16S, and abnormality-handling circuit part 16E are arranged at intervals of 90 degrees so as to form a three-sided rectangle as viewed in the axial direction of rotating shaft 23. Furthermore, main power conversion circuit part 16M, power conversion circuit 16S, and abnormality-handling circuit part 16E are arranged to surround the rotation-sensing target part 24 of rotating shaft 23. This serves to enhance the efficiency of installation, and suppress the axial size from being enlarged.

Figure 7:
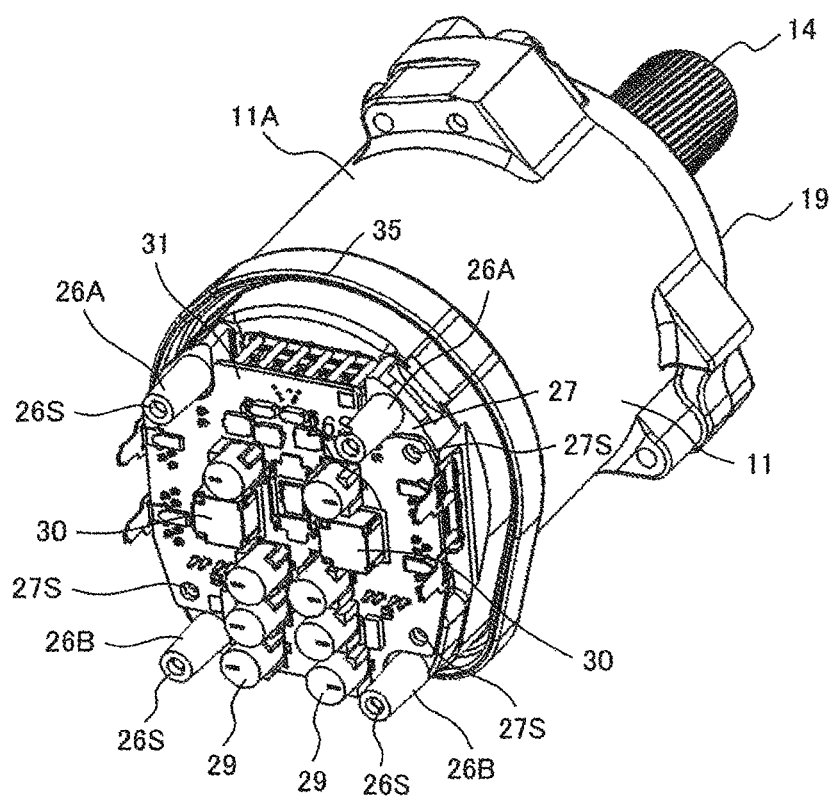
FIG. 7 is a perspective view of the motor housing shown in FIG. 4 where a power supply circuit part is mounted to the motor housing.

FIG. 7 shows a state where power supply circuit part 17 is placed over power conversion circuit part 16. As shown in FIG. 7, power supply heat dissipation region 15B is covered by power supply circuit part 17. Capacitors 29 and coils 30 of power supply circuit part 17 and capacitors 29 of the power conversion circuit part and others are placed on glass epoxy board 31. Power supply circuit part 17 is also configured to be redundant and include power supply circuits each of which is composed of capacitors 29 and coil 30 and arranged symmetrically with each other as shown in FIG. 7.

The surface of glass epoxy board 31 facing the power supply heat dissipation region 15B is fixed to end face wall 15 in contact with power supply heat dissipation region 15B. As shown in FIG. 7, this fixing is implemented by bolting with a fixing bolt not shown through screw hole 27S formed in each board-receiving part 27 of board-fixing projecting part 26, and also with a fixing bolt not shown through screw hole 27S formed in power supply heat dissipation region 15B (=board-fixing part 26B).

The configuration that power supply circuit part 17 is based on glass epoxy board 31 allows the components of power supply circuit part 17 to be mounted on both sides of the power supply circuit part 17. The surface of glass epoxy board 31 facing the power supply heat dissipation region 15B is provided with a sensing part for sensing the rotational phase and speed of rotating shaft 23 in cooperation with rotation-sensing target part 24 of rotating shaft 23, wherein the sensing part includes a GMR element and a sensing circuit not shown.

The configuration that glass epoxy board 31 is fixed to power supply heat dissipation region 15B in contact with power supply heat dissipation region 15B as described above, allows the generated heat of power supply circuit part 17 to be transferred to power supply heat dissipation region 15B effectively. The heat transferred to power supply heat dissipation region 15B is transferred and spread into lateral peripheral surface part 11A of motor housing 11, and then dissipated to the outside. In order to enhance the thermal conductivity, an adhesive agent or dissipation grease or dissipation sheet having a high thermal conductivity may be disposed between glass epoxy board 31 and power supply heat dissipation region 15B.

Figure 8:
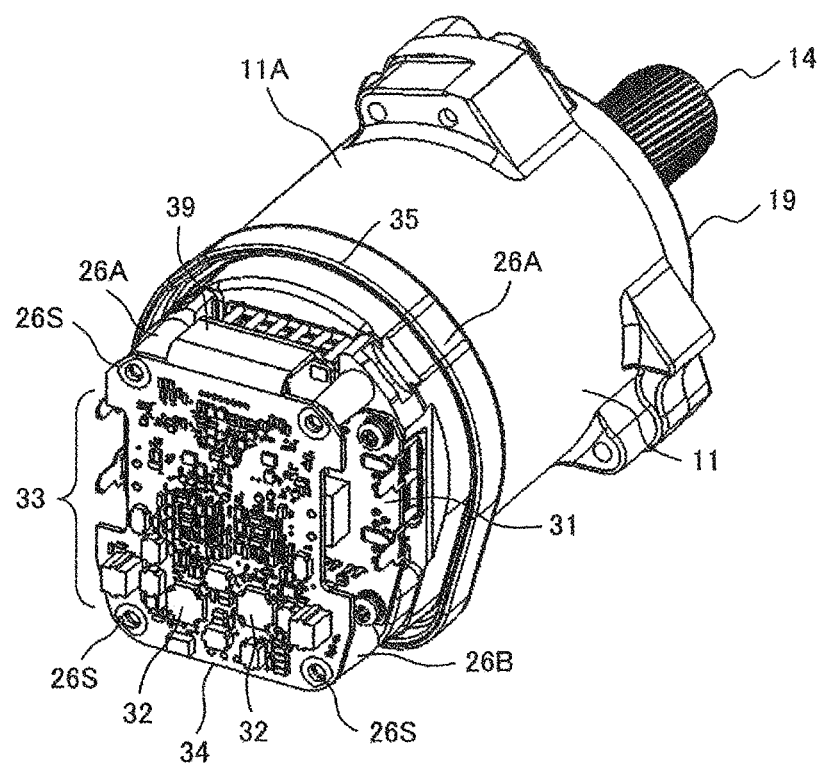
FIG. 8 is a perspective view of the motor housing shown in FIG. 4 where a control circuit part is mounted to the motor housing.

FIG. 8 shows a state where control circuit part 18 is placed over the power supply circuit part 17. Microcomputers 32 and peripheral circuits 33 constituting the control circuit part 18 are placed on glass epoxy board 34. Control circuit part 18 is also configured to be redundant, and include control circuits each of which is composed of microcomputer 32 and peripheral circuits 33 and arranged symmetrically with each other as shown in FIG. 8. Microcomputers 32 and peripheral circuits 33 may be placed on the surface of glass epoxy board 34 facing the power supply circuit part 17.

As shown in FIG. 8, control circuit part 18 is placed over power supply circuit part 17, and is connected to power supply circuit part 17 via a flexible board 39. As shown in FIG. 8, glass epoxy board 34 is fixed by putting fixing bolts not shown into screw holes 26S formed in top portions of board-fixing parts 26A, 26B. In a space between glass epoxy board 31 of power supply circuit part 17 and glass epoxy board 34 of control circuit part 18, capacitors 29, coils 30, etc., of power supply circuit part 17 shown in FIG. 7 are arranged.

Figure 9:
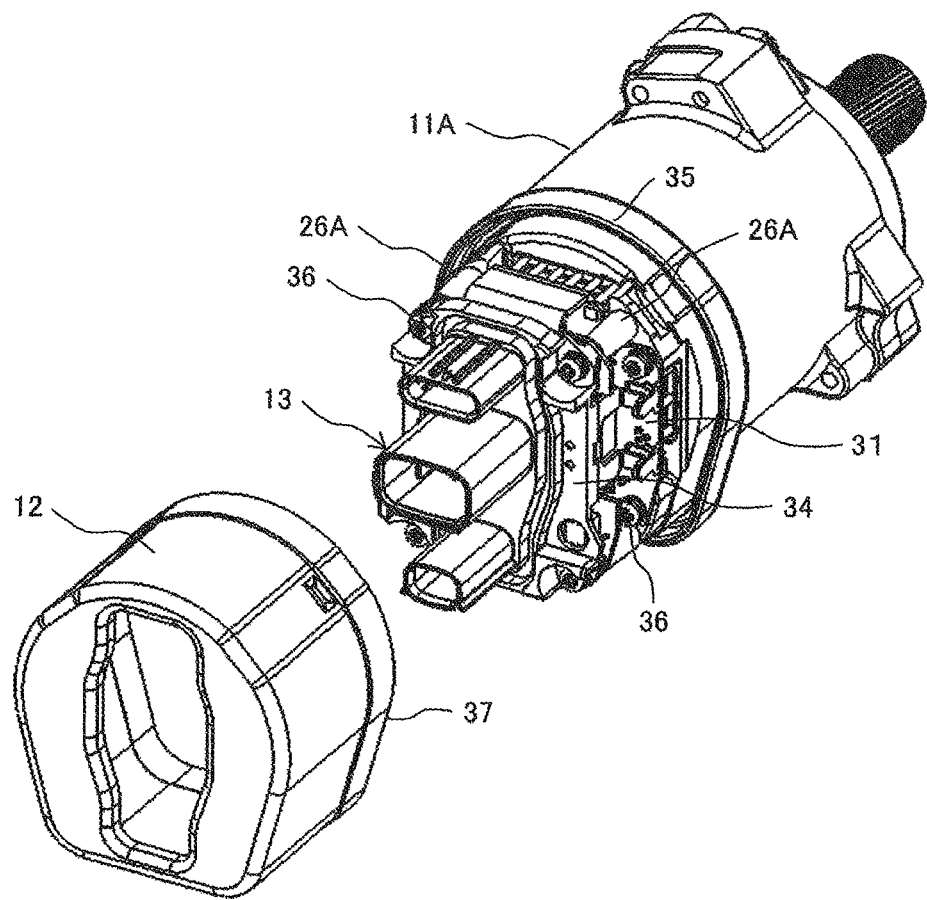
FIG. 9 is a perspective view of the motor housing shown in FIG. 4 where a metal cover is fixed to the motor housing.

FIG. 9 shows a state where connector terminal assembly 13 is placed over control circuit part 18. As shown in FIG. 9, control circuit part 18 is covered by connector terminal assembly 13. Connector terminal assembly 13 is fixed by putting fixing screws 36 into screw holes 26S formed in top portions of board-fixing parts 26A, 26B, sandwiching the control circuit part 18. In this way, connector terminal assembly 13, control circuit part 18, and glass epoxy board 34 are fastened together commonly by fixing screws 36. This allows the axial size to be shortened.

Under this condition, connector terminal assembly 13 is connected to power conversion circuit part 16, power supply circuit part 17, and control circuit part 18, as shown in FIG. 3. Thereafter, an open end 37 of metal cover 12 is fitted with and fixed by welding or bonding to a stepped portion 35 of motor housing 11.

As described above, according to the present embodiment: a motor housing includes an end face part opposite to an output part of a rotating shaft of an electric motor; the end face part of the motor housing includes a power conversion heat dissipation part and a power supply heat dissipation part for dissipation of heat occurring at least in a power conversion circuit part and a power supply circuit board to the motor housing; each of the control circuit part and the power supply circuit part is composed of a circuit board, wherein the circuit board is placed along a plane perpendicular to the rotating shaft of the electric motor, and layered with each other in an axial direction of the rotating shaft of the electric motor; and the control circuit part, the power supply circuit part, and the power conversion circuit part are covered by a metal cover, wherein the metal cover is fixed to the end face part of the motor housing.

According to this configuration, the feature that generated heat of the power supply circuit part and the power conversion circuit part is transferred to the end face part of the motor housing makes it possible to shorten the axial size with no heat sink member provided. Moreover, since the motor housing has a sufficient thermal capacity, the heat generated in the power supply circuit part and the power conversion circuit part can be dissipated to the outside effectively. Furthermore, the heat generated in the power supply circuit part and the power conversion circuit part can be dissipated to the outside effectively via the metal cover.

The present invention is not limited to the embodiment described above, but includes various modified embodiments. The described embodiment is detailed merely for easy understanding of the present invention, and the present invention is not limited to a form including all of the features described above, for example. Part of features of one of the embodiments may be replaced with features of another one of the embodiments. Features of one of the embodiments may be additionally provided with features of another one of the embodiments. Part of features of each of the embodiments may be additionally provided with other features or removed or replaced.

The electric drive device according to the embodiment described above may be exemplified as follows.

According to one aspect, an electric drive device includes: a motor housing structured to house an electric motor, wherein the motor housing includes an end face part opposite to an output part of a rotating shaft of the electric motor, and wherein the electric motor is structured to drive a controlled object of a mechanical system; and an electronic control part arranged at the end face part of the motor housing, and configured to drive the electric motor, wherein the electronic control part includes a control circuit part, a power supply circuit part, and a power conversion circuit part; wherein the end face part of the motor housing includes a power conversion heat dissipation region and a power supply heat dissipation region, wherein the power conversion circuit part is mounted to the power conversion heat dissipation region, and wherein the power supply circuit board is mounted to the power supply heat dissipation region; each of the control circuit part and the power supply circuit part is contained on a circuit board, wherein the circuit board is placed along a plane perpendicular to the rotating shaft of the electric motor, and layered with each other in an axial direction of the rotating shaft of the electric motor; and the control circuit part, the power supply circuit part, and the power conversion circuit part are covered by a metal cover, wherein the metal cover is fixed water-tightly to the end face part of the motor housing.

According to a preferable aspect, the electric drive device is configured such that the end face part of the motor housing includes a step between the power supply heat dissipation region and the power conversion heat dissipation region such that the power supply heat dissipation region projects away from the electric motor in the axial direction of the electric motor with respect to the power conversion heat dissipation region.

According to another preferable aspect, the electric drive device according to one of the foregoing aspects is configured such that the power conversion heat dissipation region is formed with a heat dissipation projecting part projecting away from the electric motor in the axial direction of the electric motor.

According to a further preferable aspect, the electric drive device according to one of the foregoing aspects is configured such that the power conversion circuit part, the power supply circuit part, and the control circuit part of the electronic control part are arranged in this order away from the electric motor in the axial direction of the electric motor.

According to a further preferable aspect, the electric drive device according to one of the foregoing aspects is configured such that the power conversion circuit part includes a main power conversion circuit part, an auxiliary power conversion circuit part, and an abnormality-handling circuit part, which are arranged at intervals of 90 degrees around the rotating shaft so as to form a three-sided rectangle as viewed in the axial direction of the rotating shaft.

According to a further preferable aspect, the electric drive device according to one of the foregoing aspects is configured such that the power supply heat dissipation region includes an extended heat dissipation region extending toward an axis of the rotating shaft, and disposed in a space forming a remainder side of the three-sided rectangle that are formed by the main power conversion circuit part, the auxiliary power conversion circuit part, and the abnormality-handling circuit part.

According to a further preferable aspect, the electric drive device according to one of the foregoing aspects is configured such that the electric drive device further includes a flexible board connecting the power supply circuit part to the control circuit part.

According to a further preferable aspect, the electric drive device according to one of the foregoing aspects is configured such that: each of the power conversion heat dissipation region and the power supply heat dissipation region is formed with a pair of board-fixing parts extending away from the output part of the rotating shaft in the axial direction of the rotating shaft; the circuit board of the power supply circuit part is fixed to the power supply heat dissipation region, and fixed to the pair of board-fixing parts formed in the power conversion heat dissipation region; and the circuit board of the control circuit part is fixed to the pair of board-fixing parts formed in the power supply heat dissipation region, and is fixed to the pair of board-fixing parts formed in the power conversion heat dissipation region.

The electric power steering device according to the embodiment described above may be exemplified as follows.

According to one aspect, an electric power steering device includes: an electric motor structured to apply a steering assist force to a steering shaft, depending on an output from a torque sensor, wherein the torque sensor is structured to sense a direction of rotation of the steering shaft and a rotating torque applied to the steering shaft; a motor housing structured to house the electric motor, wherein the motor housing includes an end face part opposite to an output part of a rotating shaft of the electric motor; and an electronic control part arranged at the end face part of the motor housing, and configured to drive the electric motor, wherein the electronic control part includes a control circuit part, a power supply circuit part, and a power conversion circuit part; wherein the end face part of the motor housing includes a power conversion heat dissipation region and a power supply heat dissipation region, wherein the power conversion circuit part is mounted to the power conversion heat dissipation region, and wherein the power supply circuit board is mounted to the power supply heat dissipation region; each of the control circuit part and the power supply circuit part is contained on a circuit board, wherein the circuit board is placed along a plane perpendicular to the rotating shaft of the electric motor, and layered with each other in an axial direction of the rotating shaft of the electric motor; and the control circuit part, the power supply circuit part, and the power conversion circuit part are covered by a metal cover, wherein the metal cover is fixed water-tightly to the end face part of the motor housing.

According to a preferable aspect, the electric power steering device is configured such that the end face part of the motor housing includes a step between the power supply heat dissipation region and the power conversion heat dissipation region such that the power supply heat dissipation region projects away from the electric motor in the axial direction of the electric motor with respect to the power conversion heat dissipation region.

According to another preferable aspect, the electric power steering device according to one of the foregoing aspects is configured such that the power conversion heat dissipation region is formed with a heat dissipation projecting part projecting away from the electric motor in the axial direction of the electric motor.

According to a further preferable aspect, the electric power steering device according to one of the foregoing aspects is configured such that the power conversion circuit part, the power supply circuit part, and the control circuit part of the electronic control part are arranged in this order away from the electric motor in the axial direction of the electric motor.

According to a further preferable aspect, the electric power steering device according to one of the foregoing aspects is configured such that the power conversion circuit part includes a main power conversion circuit part, an auxiliary power conversion circuit part, and an abnormality-handling circuit part, which are arranged at intervals of 90 degrees around the rotating shaft so as to form a three-sided rectangle as viewed in the axial direction of the rotating shaft.

According to a further preferable aspect, the electric power steering device according to one of the foregoing aspects is configured such that the power supply heat dissipation region includes an extended heat dissipation region extending toward an axis of the rotating shaft, and disposed in a space forming a remainder side of the three-sided rectangle that are formed by the main power conversion circuit part, the auxiliary power conversion circuit part, and the abnormality-handling circuit part.

According to a further preferable aspect, the electric power steering device according to one of the foregoing aspects is configured such that the electric power steering device further includes a flexible board connecting the power supply circuit part to the control circuit part.

According to a further preferable aspect, the electric power steering device according to one of the foregoing aspects is configured such that: each of the power conversion heat dissipation region and the power supply heat dissipation region is formed with a pair of board-fixing parts extending away from the output part of the rotating shaft in the axial direction of the rotating shaft; the circuit board of the power supply circuit part is fixed to the power supply heat dissipation region, and fixed to the pair of board-fixing parts formed in the power conversion heat dissipation region; and the circuit board of the control circuit part is fixed to the pair of board-fixing parts formed in the power supply heat dissipation region, and is fixed to the pair of board-fixing parts formed in the power conversion heat dissipation region.

The invention claimed is:

1. An electric drive device comprising:
a motor housing structured to house an electric motor, wherein the motor housing includes an end face part opposite to an output part of a rotating shaft of the electric motor, and wherein the electric motor is structured to drive a controlled object of a mechanical system; and
an electronic control part arranged at the end face part of the motor housing, and configured to drive the electric motor, wherein the electronic control part includes a control circuit part, a power supply circuit part, and a power conversion circuit part; wherein
the end face part of the motor housing includes a power conversion heat dissipation region and a power supply heat dissipation region, wherein the power conversion circuit part is mounted to the power conversion heat dissipation region, and wherein the power supply circuit part is mounted to the power supply heat dissipation region;
the control circuit part is contained on a first circuit board, wherein the first circuit board is disposed along a first plane perpendicular to the rotating shaft of the electric motor;
the power supply circuit part is contained on a second circuit board, wherein the second circuit board is disposed along a second plane perpendicular to the rotating shaft of the electric motor;
the first circuit board and the second circuit board are layered with each other in an axial direction of the rotating shaft of the electric motor;

the control circuit part, the power supply circuit part, and the power conversion circuit part are covered by a metal cover, wherein the metal cover is fixed watertightly to the end face part of the motor housing; and the end face part of the motor housing includes a step between the power supply heat dissipation region and the power conversion heat dissipation region such that the power supply heat dissipation region projects away from the electric motor in the axial direction of the electric motor with respect to the power conversion heat dissipation region.

2. The electric drive device as claimed in claim 1, wherein the power conversion heat dissipation region is formed with a heat dissipation projecting part projecting away from the electric motor in the axial direction of the electric motor.

3. The electric drive device as claimed in claim 1, wherein the power conversion circuit part, the power supply circuit part, and the control circuit part of the electronic control part are arranged in this order away from the electric motor in the axial direction of the electric motor.

4. The electric drive device as claimed in claim 3, wherein the power conversion circuit part includes a main power conversion circuit part, an auxiliary power conversion circuit part, and an abnormality-handling circuit part, which are arranged at intervals of 90 degrees around the rotating shaft so as to form a three-sided rectangle as viewed in the axial direction of the rotating shaft.

5. The electric drive device as claimed in claim 4, wherein the power supply heat dissipation region includes an extended heat dissipation region extending toward an axis of the rotating shaft, and disposed in a space forming a remainder side of the three-sided rectangle formed by the main power conversion circuit part, the auxiliary power conversion circuit part, and the abnormality-handling circuit part.

6. The electric drive device as claimed in claim 3, further comprising a flexible board connecting the power supply circuit part to the control circuit part.

7. The electric drive device as claimed in claim 3, wherein:
each of the power conversion heat dissipation region and the power supply heat dissipation region is formed with a pair of board-fixing parts extending away from the output part of the rotating shaft in the axial direction of the rotating shaft;
the second circuit board is fixed to the power supply heat dissipation region, and fixed to the pair of board-fixing parts formed in the power conversion heat dissipation region; and
the first circuit board is fixed to the pair of board-fixing parts formed in the power supply heat dissipation region, and is fixed to the pair of board-fixing parts formed in the power conversion heat dissipation region.

8. An electric power steering device comprising:
an electric motor structured to apply a steering assist force to a steering shaft, depending on an output from a torque sensor, wherein the torque sensor is structured to sense a direction of rotation of the steering shaft and a rotating torque applied to the steering shaft;
a motor housing structured to house the electric motor, wherein the motor housing includes an end face part opposite to an output part of a rotating shaft of the electric motor; and
an electronic control part arranged at the end face part of the motor housing, and configured to drive the electric motor, wherein the electronic control part includes a control circuit part, a power supply circuit part, and a power conversion circuit part; wherein the end face part of the motor housing includes a power conversion heat dissipation region and a power supply heat dissipation region, wherein the power conversion circuit part is mounted to the power conversion heat dissipation region, and wherein the power supply circuit part is mounted to the power supply heat dissipation region;

the control circuit part is contained on a first circuit board, wherein the first circuit board is disposed along a first plane perpendicular to the rotating shaft of the electric motor;

the power supply circuit part is contained on a second circuit board, wherein the second circuit board is disposed along a second plane perpendicular to the rotating shaft of the electric motor;

the first circuit board and the second circuit board are layered with each other in an axial direction of the rotating shaft of the electric motor;

the control circuit part, the power supply circuit part, and the power conversion circuit part are covered by a metal cover, wherein the metal cover is fixed watertightly to the end face part of the motor housing; and the end face part of the motor housing includes a step between the power supply heat dissipation region and the power conversion heat dissipation region such that the power supply heat dissipation region projects away from the electric motor in the axial direction of the electric motor with respect to the power conversion heat dissipation region.

9. The electric power steering device as claimed in claim 8, wherein the power conversion heat dissipation region is formed with a heat dissipation projecting part projecting away from the electric motor in the axial direction of the electric motor.

10. The electric power steering device as claimed in claim 9, wherein the power conversion circuit part, the power supply circuit part, and the control circuit part of the electronic control part are arranged in this order away from the electric motor in the axial direction of the electric motor.

11. The electric power steering device as claimed in claim 10, wherein the power conversion circuit part includes a main power conversion circuit part, an auxiliary power conversion circuit part, and an abnormality-handling circuit part, which are arranged at intervals of 90 degrees around the rotating shaft so as to form a three-sided rectangle as viewed in the axial direction of the rotating shaft.

12. The electric power steering device as claimed in claim 11, wherein the power supply heat dissipation region includes an extended heat dissipation region extending toward an axis of the rotating shaft, and disposed in a space forming a remainder side of the three-sided rectangle formed by the main power conversion circuit part, the auxiliary power conversion circuit part, and the abnormality-handling circuit part.

13. The electric power steering device as claimed in claim 10, further comprising a flexible board connecting the power supply circuit part to the control circuit part.

14. The electric power steering device as claimed in claim 10, wherein:
each of the power conversion heat dissipation region and the power supply heat dissipation region is formed with a pair of board-fixing parts extending away from the output part of the rotating shaft in the axial direction of the rotating shaft;

the second circuit board is fixed to the power supply heat dissipation region, and fixed to the pair of board-fixing parts formed in the power conversion heat dissipation region; and the first circuit board is fixed to the pair of board-fixing parts formed in the power supply heat dissipation region, and is fixed to the pair of board-fixing parts formed in the power conversion heat dissipation region.

\* \* \* \* \*